(12) United States Patent
Sergent et al.

(10) Patent No.: US 6,449,837 B1
(45) Date of Patent: Sep. 17, 2002

(54) METHOD FOR ATTACHING ELECTRONIC DEVICES TO METALLIZED GLASS PRINTED CIRCUIT

(75) Inventors: Jerry Elden Sergent, Corbin; Alvin Wells, London, both of KY (US)

(73) Assignee: TCA, Inc., Williamsburg, KY (US)

( * ) Notice: Subject to any disclaimer, the term of this patent is extended or adjusted under 35 U.S.C. 154(b) by 0 days.

(21) Appl. No.: 09/430,106

(22) Filed: Oct. 29, 1999

(51) Int. Cl.$^7$ .................................................. H05K 3/30
(52) U.S. Cl. .............................. 29/832; 29/833; 29/840; 228/223
(58) Field of Search .......................... 29/825, 832, 830, 29/740, 840, 833; 228/223

(56) References Cited

U.S. PATENT DOCUMENTS

| | | | |
|---|---|---|---|
| 5,365,656 A | | 11/1994 | Dahringer et al. |
| 5,860,212 A | * | 1/1999 | Matsuhira |
| 6,000,127 A | * | 12/1999 | Eifuku et al. |

FOREIGN PATENT DOCUMENTS

| | | | |
|---|---|---|---|
| JP | 04-011797 Ai | * | 1/1992 |
| JP | 06-11683 | * | 1/1994 |

OTHER PUBLICATIONS

45th Electroncs Components and Technology Conference, Las Vegas, May 1995, a paper by Chang et al, publ by IEEE, pp. 121–125.*

Alan M. Lyons et al., "A New Approach to Using Anisotropically Conductive Adhesives for Flip–Chip Assembly," *IEEE Transactions on Components, Packaging, and Manufacturing Technology*, Part A, vol. 19, No. 1, Mar. 1996.

R. Aschenbrenner et al., "Flip Chip Attachment Using Non–Conductive Adhesives and Gold Ball Bumps," *The International Journal of Microcircuits and Electronic Packaging*, vol. 18, No. 2, Second Quarter 1995.

Takao Komukai et al., "An Approach to the Anisotropic Conductive Adhesives for Micro–Interconnection Technology," *Dexter Electronic Materials Division Technical Paper*, Oct. 1996, pp. 1–6.

H. Date et al., "Anisotropic Conductive Adhesive for Fine Pitch Interconnections," *ISHM '94 Proceedings*, pp. 570–575.

Helmut Kergel et al., "Assembly Equipment for Low–Cost Flip Chip Technologies," 6 pages.

Chang Hoon Lee et al., "Flip Chip–on–Glass with Anisotropically Conductive Adhesives," *Electronic Packaging & Production*, Aug. 1995, pp. 74–77.

* cited by examiner

*Primary Examiner*—Carl J. Arbes
(74) *Attorney, Agent, or Firm*—Kilpatrick Stockton LLP

(57) ABSTRACT

There is disclosed a novel method for attaching electronic components to an electric circuit printed on a glass substrate. The method comprises depositing a desired quantity of an uncured, ultraviolet radiation-curable, anisotropic conductive adhesive in a desired location on a metallized glass substrate having an electric circuit formed on a surface thereof. An electronic component having electrical contacts formed on a portion thereof is applied to the uncured, deposited adhesive so that the bumps are positioned in the adhesive and in register with desired portions of the electric circuit on the substrate. An amount of pressure sufficient to render the adhesive selectively conductive at locations between the electric circuit and the electrical contact on the electronic component and substantially nonconductive at other locations is applied to the electronic component, such that the electrical contacts make an electrical connection with desired portions of the electric circuit. Then, the adhesive is irradiated with ultraviolet radiation of a sufficient flux to substantially cure the adhesive.

29 Claims, 8 Drawing Sheets

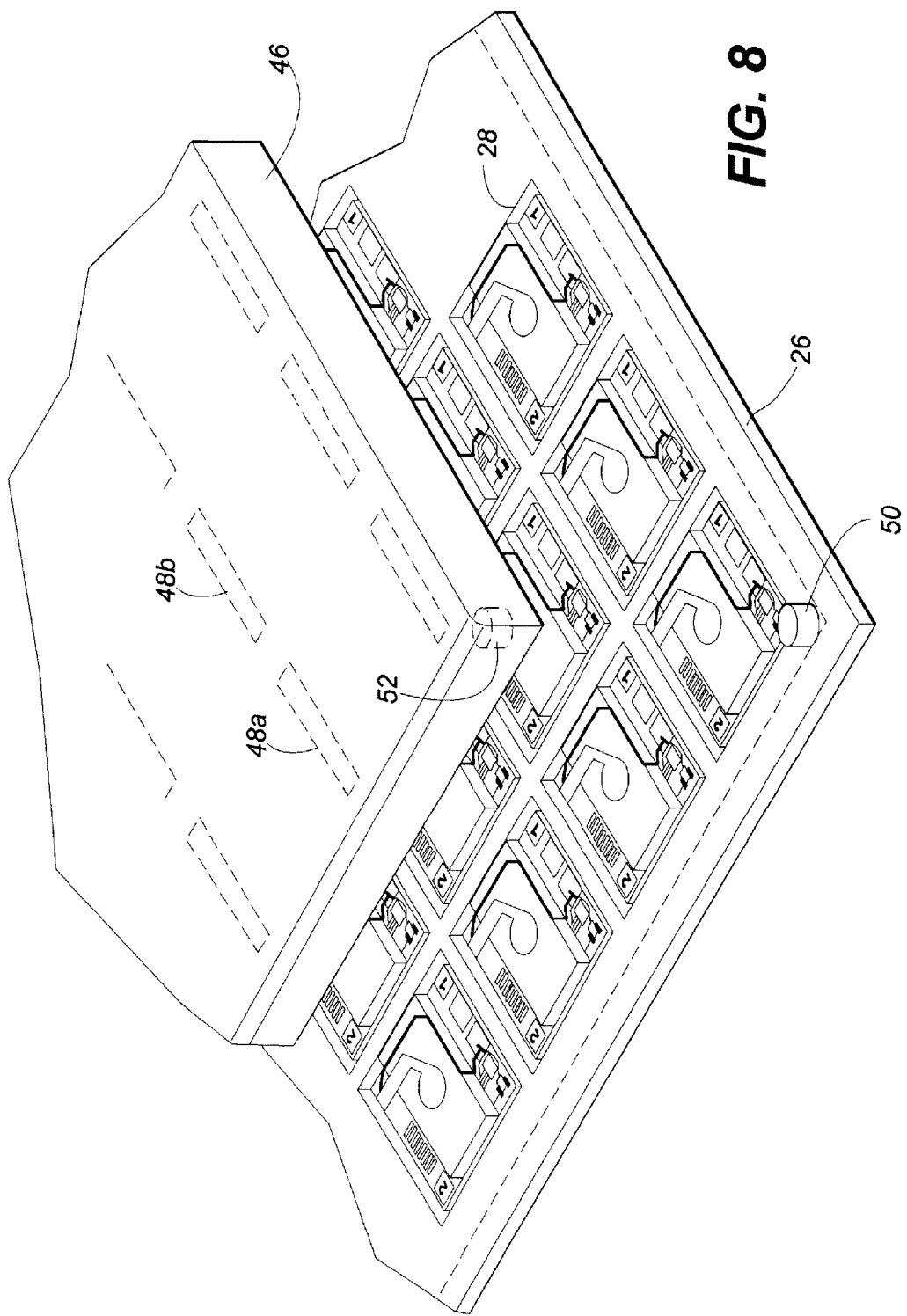

METHOD FOR ATTACHING ELECTRONIC DEVICES TO METALLIZED GLASS PRINTED CIRCUIT

FIELD OF INVENTION

The present invention relates generally to printed circuits and the attachment of electronic components thereto. More particularly the present invention relates to a method for the attachment of electronic components, such as large-scale integrated circuits, capacitors, resistors and the like, on metallized glass substrates having electric circuits printed thereon, and establishing an electrical connection between the electronic components and the electric circuit on the substrate.

BACKGROUND OF THE INVENTION

The miniaturization of electronic components has presented challenges in terms of the development of relatively fast, relatively inexpensive methods for attaching miniature electronic components, such as capacitors, integrated circuits, computer chips, and the like, to printed circuit boards, especially metallized glass substrates having electronic circuits printed thereon.

One process for attaching electronic components to printed wiring boards is disclosed in U.S. Pat. No. 5,365,656 to AT&T (incorporated by reference herein). That patent utilizes electrically anisotropic conductive adhesives to attach the electronic devices to the printed wiring board and also to form conductive electrical interconnection between the leads or bumps of the electronic devices and the printed wiring board. The method comprises applying the adhesive on the printed wiring board, placing the printed wiring board on a platen, placing the electronic device into the adhesive in alignment with the conductors on the printed wiring board, placing a spacer on the platen to form a chamber around the printed wiring board, positioning a resilient stretchable membrane above the spacer, optionally applying a vacuum to the chamber to draw the membrane down into contact with the devices, applying a fluid under pressure to the membrane so as to force the contacts of the devices toward the conductors of the printed wiring board, and applying heat to the assembly to cure the adhesive.

The process disclosed in the AT&T patent presents difficulties in applying uniform pressure to the electronic devices when dealing with large-scale production, such as treating approximately 100 printed wiring boards at a time. Furthermore, the AT&T process does not provide the ability to apply different pressures to different electronic devices mounted to the same printed wiring board. Moreover, the AT&T process relies upon the application of heat to cure the adhesive, and heat can adversely affect delicate electronic components. The use of heat to cure the adhesive also results in extended curing times, thus reducing the overall productivity of the process.

Therefore, a need exists for a process that overcomes the problems associated with the prior art.

SUMMARY OF THE INVENTION

The present invention satisfies the above-described needs by providing a novel method for attaching electronic components to metallized glass substrates having an electric circuit printed thereon. The method comprises depositing a desired quantity of an uncured, ultraviolet radiation-curable, anisotropic conductive adhesive in a desired location on a metallized glass substrate having an electric circuit formed on a surface of the substrate. An electronic component having electrical contacts or bumps formed on a portion thereof is then applied to the uncured, deposited adhesive wherein the electronic component is oriented so that the electrical contacts or bumps are positioned in the adhesive and in register with desired portions of the electric circuit on the substrate. Sufficient pressure is then applied to the electronic component to render the adhesive selectively conductive at locations between the electric circuit and the electrical contacts or bumps on the electronic component and substantially nonconductive at other locations, such that the electrical contacts or bumps make an electrical connection with desired portions of the electric circuit. Then, the adhesive is cured by irradiating the adhesive with ultraviolet radiation of a sufficient flux to substantially cure the adhesive.

In an alternate embodiment of the present invention the method comprises placing a plurality of metallized glass substrates having an electric circuit formed on a surface of the substrate into a carrier. The carrier defines a plurality of cavities, each cavity being adapted to receive and retain a substrate therein. A desired quantity of an uncured, ultraviolet radiation-curable, anisotropic adhesive is deposited in a desired location on each of the substrates in the carrier. An electronic component having electrical contacts or bumps formed on a portion thereof is then applied to each of the deposits of uncured adhesive on each substrate wherein the electronic component is oriented so that the electrical contacts or bumps are positioned in the adhesive and in register with desired portions of the electric circuit on the substrate. Pressure is simultaneously applied to each electronic component in the carrier. The amount of pressure is sufficient to render the adhesive selectively conductive at locations between the electric circuit and the electrical contacts or bumps on the electronic component and substantially nonconductive at other locations, such that the electrical contacts or bumps make an electrical connection with desired portions of the electric circuit. Then, the adhesive is cured by irradiating the adhesive deposits with ultraviolet radiation of a sufficient flux and for a sufficient time to substantially cure the adhesive.

In another disclosed embodiment of the present invention, there is disclosed a process for mounting at least one electronic device having electrical contacts onto an interconnection substrate having electrical conductors so as to establish an electrical interconnection between the contacts and the conductors, the interconnection substrate being substantially transparent to ultraviolet radiation. The process comprises applying a quantity of uncured, ultraviolet radiation-curable, anisotropic adhesive over a region on the interconnection substrate, the region including conductors to be electrically connected to contacts of at least one electronic device. An assembly is formed of the at least one device and the interconnection substrate by placing the at least one device on the interconnection substrate such that the contacts of the at least one device are in alignment with the conductors in the region of the substrate. Pressure is applied to the at least one device so as to force the contacts of the at least one device toward the conductors of the substrate. The adhesive is irradiated with ultraviolet radiation from a source positioned below the substrate such that the adhesive forms an electrical and mechanical interconnection between the contacts of the device and the conductors of the substrate.

In still another disclosed embodiment of the present invention, there is disclosed a process for mounting a plurality of electronic devices each having electrical contacts onto a plurality of interconnection substrates each having electrical conductors so as to establish an electrical interconnection between the contacts and the conductors, the interconnection substrates being substantially transparent to ultraviolet radiation. The process comprises positioning a plurality of substrates in a carrier. A quantity of uncured, ultraviolet radiation-curable, anisotropic adhesive is applied over a region on each interconnection substrate, the region including conductors to be electrically connected to contacts of the devices. For each substrate in the carrier, an assembly is formed of the devices and the interconnection substrates by placing at least one device on each interconnection substrate such that the contacts of the devices are in alignment with the conductors in the region of the substrate. A die is positioned above the carrier, the die including a plurality of pressure pads, the pressure pads being disposed on the die such that the pressure pads contact the devices on the substrates when the die is positioned above the carrier. Pressure is simultaneously applied to said devices through said pressure pads so as to force the contacts of said devices toward the conductors of the substrates. The uncured adhesive on the plurality of substrates is irradiated with ultraviolet radiation from a source positioned below the substrates such that the adhesive forms an electrical and mechanical interconnection between the contacts of the devices and the conductors of the substrates.

Accordingly, it is an object of the present invention to provide an improved method of connecting electronic components to metallized glass substrates having an electrical circuit printed thereon.

Another object of the present invention is to provide a method of attaching different sized and shaped electronic components to the same metallized glass substrate having an electrical circuit printed thereon.

Another object of the present invention is to provide a method of attaching electronic components to metallized glass substrates having an electrical circuit printed thereon that does not involve exposing the electronic components to excessive amounts of heat.

A further object of the present invention is to provide a method of attaching electronic components to metallized glass substrates having an electrical circuit printed thereon using an ultraviolet radiation-curable, anisotropic conductive adhesive.

Yet another object of the present invention is to provide a method of attaching electronic components to metallized glass substrates having an electrical circuit printed thereon that is relatively fast and relatively inexpensive.

Still another object of the present invention is to provide a method of simultaneously attaching a electronic components to a plurality of metallized glass substrates having an electrical circuit printed thereon.

These and other objects, features and advantages of the present invention will become apparent after a review of the following detailed description of the disclosed embodiments and the appended drawing and claims.

BRIEF DESCRIPTION OF THE DRAWING

FIG. 8 is a perspective view of the die shown in FIG. 6 positioned above the carrier shown in FIG. 3 shown holding a plurality of metallized glass substrates shown in FIG. 1 with two electronic components positioned in quantities of uncured adhesive on each substrate.

DESCRIPTION OF THE DISCLOSED EMBODIMENTS

Figure 1:
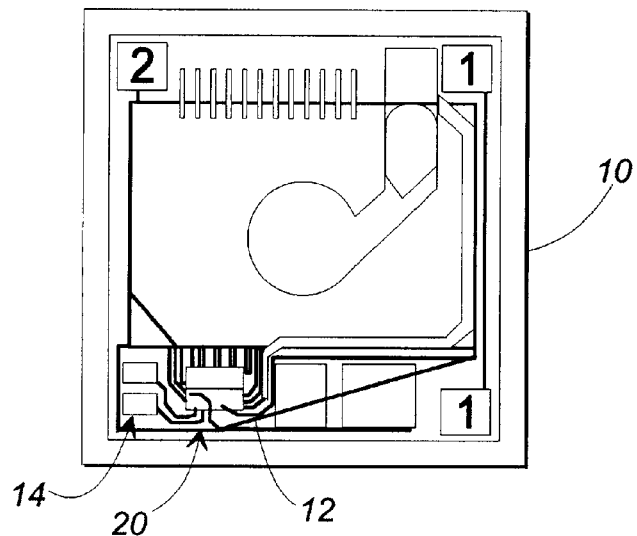
FIG. 1 is a top plan view of a disclosed embodiment of a metallized glass substrate having an electric circuit printed thereon useful in the present invention.

With reference to the drawing in which like numbers indicate like elements throughout the several views, it can be seen that there is a metallized glass substrate 10 having an electrical circuit 12 printed thereon. Metallized glass substrates are well known to those skilled in the art. The particular circuit 12 that is illustrated (FIG. 1) is a liquid crystal display carrier pallet. This circuit 12 is designed for attachment to and control of a liquid crystal display. Such liquid crystal displays are found in numerous commonplace items, such as watches, digital counters, and the like.

The glass from which the substrate 10 is made is typically a lead/borosilicate, soda/lime or bismuth-based glass. The precise material from which the glass substrate 10 is made is not critical to the present invention. However, it is critical that the glass must be substantially transparent to ultraviolet radiation, especially ultraviolet radiation having a wavelength of approximately 300–500 nm. The metallizing material from which the electrical circuit 12 formed on the glass substrate 10 is made is similarly not critical to the present invention and any conventional metallizing material, such as indium tin oxide, may be used as long as it is substantially transparent to ultraviolet radiation, especially ultraviolet radiation having a wavelength of approximately 300–500 nm.

Figure 2:
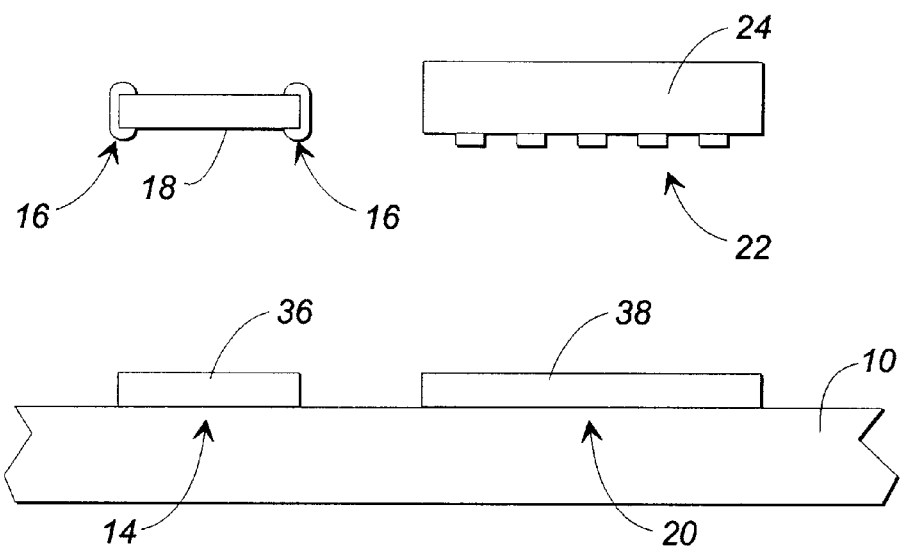
FIG. 2 is a detail side view of a pair of electronic components disposed above the metallized glass substrate shown in FIG. 1.

The electrical circuit 12 that is printed on the substrate 10 includes a pair of electrical contacts 14 for attachment to a pair of electrical contacts 16 of a capacitor 18 (FIG. 2). The electrical circuit 12 also includes a plurality of electrical contacts 20 for attachment to a plurality of electrical contacts 22 of a large scale integrated circuit ("LSIC") 24, a computer chip and the like. The electrical contacts 20 on the LSIC 24 are known to those skilled in the art as bumps and the processes by which those bumps are formed is also know to those skilled in the art. Conventional techniques for forming bumps include photolithography, electroless nickel plating directly on the bonding pads followed by electroless gold plating, and thermosonic bonding of gold bumps. The bumps are typically approximately 25–30 microns in thickness. Furthermore, the bumps are typically flattened and planarized by pressure from a plate so the bumps are of equal thickness. The electrical contacts 16 on the capacitor 18 are formed by the end terminations of the capacitor. The end terminations of the capacitor 18 are typically made of nickel and palladium silver. A natural bump of sorts occurs during the formation of the end terminations and does not require further treatment to be suitable for use in the present invention.

Figure 3:
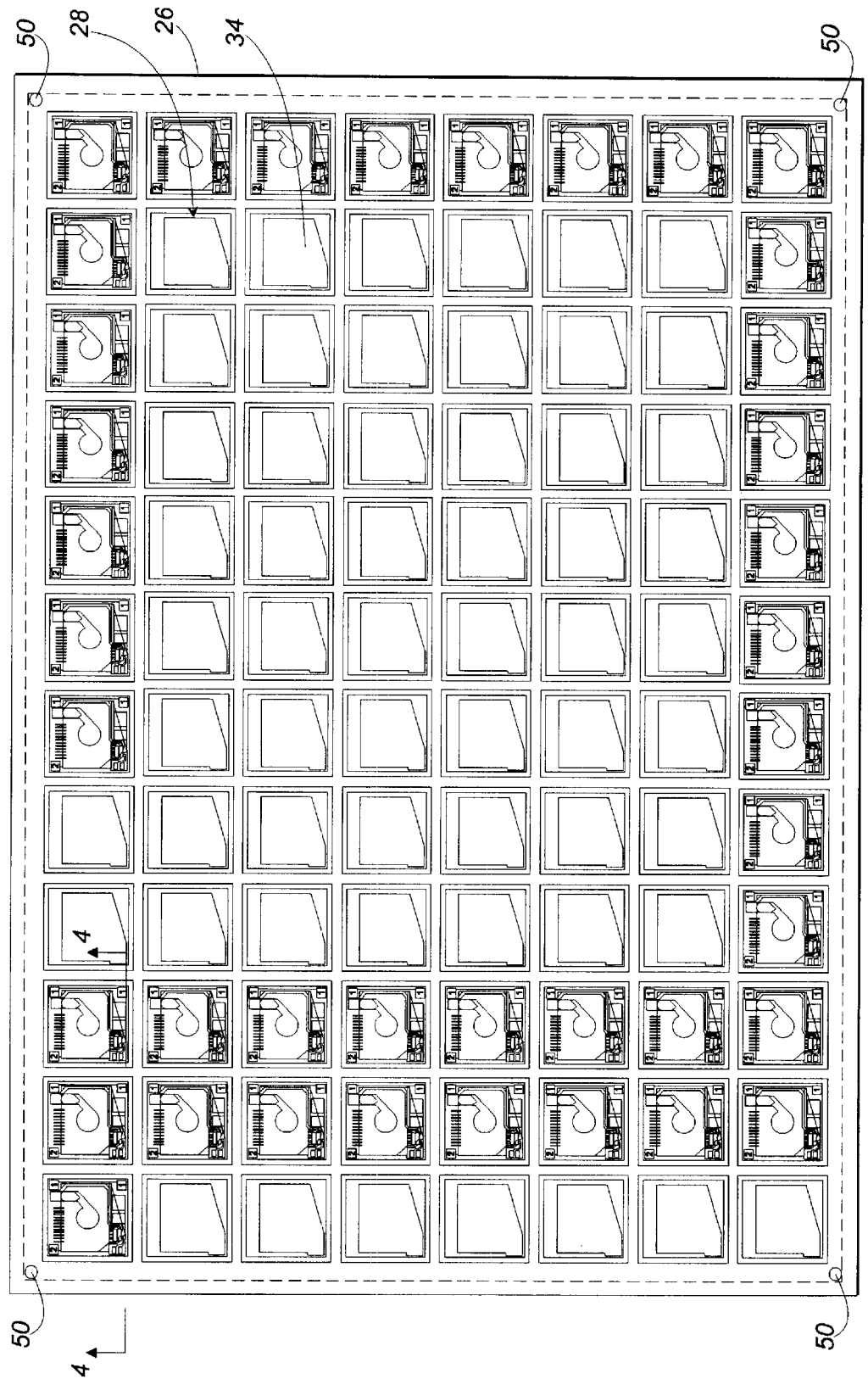
FIG. 3 is top plan view of a disclosed embodiment of a carrier useful in the present invention for holding a plurality of the metallized glass substrates shown in FIG. 1.

The process of the present invention is practiced by placing a plurality of the metallized glass substrates 10 into a carrier 26 (FIG. 3). The carrier 26 comprises a generally rectangular plate that defines a plurality of substrate-receiving cavities 28 arranged in a grid of rows and columns. Each substrate-receiving cavity 28 includes sloped sidewalls 30 and a substrate-supporting ledge 32 for supporting the peripheral edge of the substrate 10. The cavity 28 also includes an opening 34 through which light can pass from below the carrier and can illuminate a desired portion of the substrate 10. The opening 34 is located so that the portion of the substrate 10 that can be illuminate from below the carrier 26 is that portion of the substrate that includes the contacts 14, 20. The carrier is made from any substantially rigid material, such as aluminum, stainless steel, or plastic. As an alternative to providing the opening 34 in the carrier 26, it is specifically contemplated that the carrier may be made from a material that is substantially transparent to ultraviolet radiation, such as plastic or glass. In this way, if the carrier 26 is transparent to ultraviolet radiation, a desired portion of the substrate 10 located in the substrate-receiving cavity 28 can be illuminated with ultraviolet radiation from a source of ultraviolet radiation located below the carrier and the carrier does not need to include the opening 34.

One substrate 10 is loaded into each substrate-receiving cavity 28. The substrates 10 are loaded into the substrate-receiving cavities 28 so that a desired portion of the electric circuit 12 is aligned with the opening, but on the side of the substrate opposite the opening. The substrates 10 can be placed in the substrate-receiving cavities 28 by a robotically controlled arm (not shown).

After a substrate 10 is loaded into each of the cavities 28 of the carrier 26, a desired quantity of uncured, ultraviolet light curable, anisotropically electrically conductive adhesive is applied to one or more selected portions of each of the substrates. The adhesive can be applied to the substrate 10 by a robotically controlled pneumatic adhesive dispenser (not shown). The preferred adhesive is an ultraviolet light curable epoxy available from Uniax Corporation, Santa Barbara, Calif. under the trade names Uniax 183 and Uniax 184. Anisotropically conductive adhesives typically contain approximately 2%–40% by volume of conductive particles; preferably, approximately 20%–26%. Uniax 183 contains titanium oxide filler with a particle size of approximately 0.2μ. Uniax 184 contains nickel filler with a particle size of approximately 4μ. Ultraviolet light curable epoxies are well known to those skilled in the art.

The amount of adhesive that is applied to the substrate is a critical aspect of the present invention and is an amount that is slightly thicker than the thickness of the electrical contacts or bumps on the electronic component that is to be attached to the substrate 10. The adhesive should be approximately 2–15 microns thicker than the thickness of the electrical contacts or bumps on the electronic component. Generally, electrical contacts or bumps on electronic components are approximately 10–30 microns in thickness. Therefore, the adhesive should be applied to the substrate 10 to a thickness of approximately 12–45 microns. If too much adhesive is applied, the electronic components may move laterally too much and lose registry with the underlying electric printed circuit when pressure is applied to the electronic components or insufficient electrical contact will be established between the electronic components and the printed circuit. If too little adhesive is applied, poor adhesion may result or insufficient electrical contact will be established between the electronic components and the printed circuit. The amount of adhesive that is applied to the substrate is also dependent upon the amount of force that is applied to the electronic components that are inserted into the adhesive. This subject will be discussed further below.

The viscosity of the adhesive is also a critical aspect of the present invention. The viscosity of the adhesive must be such that when an electronic component is placed into the uncured adhesive, the adhesive is viscose enough that the adhesive holds the electronic component in the adhesive without substantial lateral movement until the adhesive is cured. The viscosity of the adhesive therefore permits the electronic components to be accurately placed with respect to the electric circuit 12 printed on the substrate 10 and maintains the electronic components in that position until curing of the adhesive is completed. Therefore, it is desirable that the adhesive has a viscosity of approximately 100,000–300,000 centipoise at 25° C.; preferably, 200,000 centipoise at 25° C.

Figure 4:
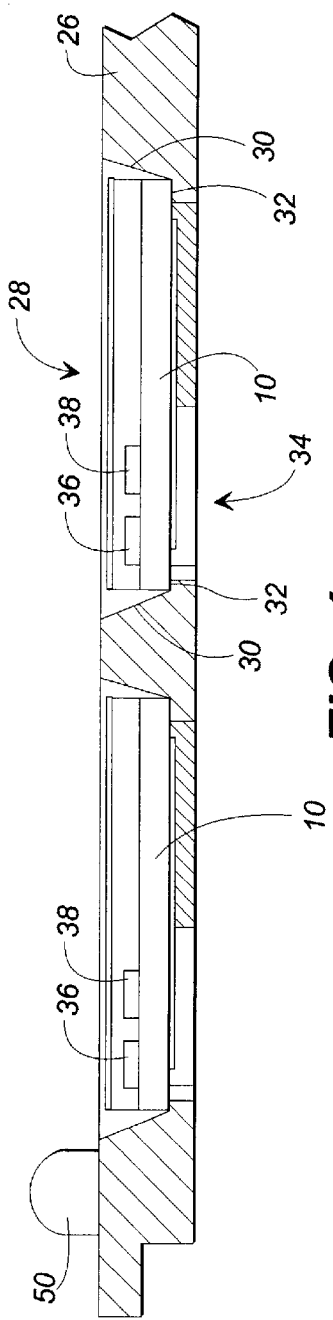
FIG. 4 is a partial cross-sectional view of the carrier shown in FIG. 3 taken along the line 4—4 shown holding two metallized glass substrates shown in FIG. 1.

The adhesive is applied to only those portions of the substrate 10 that include the contact points 14, 20 of the electric circuit 12 printed on the substrate. As can be seen in FIGS. 2 and 4 a quantity of adhesive 36 is applied over the contact points 14 and a quantity of adhesive 38 is applied over the contact points 20.

After the adhesive is applied to the substrate 10, the electronic components 18, 24 are inserted into the adhesive. A robotically controlled arm (not shown) picks up the electronic components 18, 24 and accurately places them into the adhesive such that the electrical contacts or bumps on the electronic component are in registry with the respective contact points 14, 20 on the printed circuit 12. Thus, the capacitor 18 is placed in the adhesive 36 such that the electrical contacts 16 are in registry with the contact points 14 on the printed circuit 12. Similarly, the LSIC 24 is placed in the adhesive 38 such that the bumps 22 are in registry with the contact points 20 on the printed circuit 12.

Figure 5:
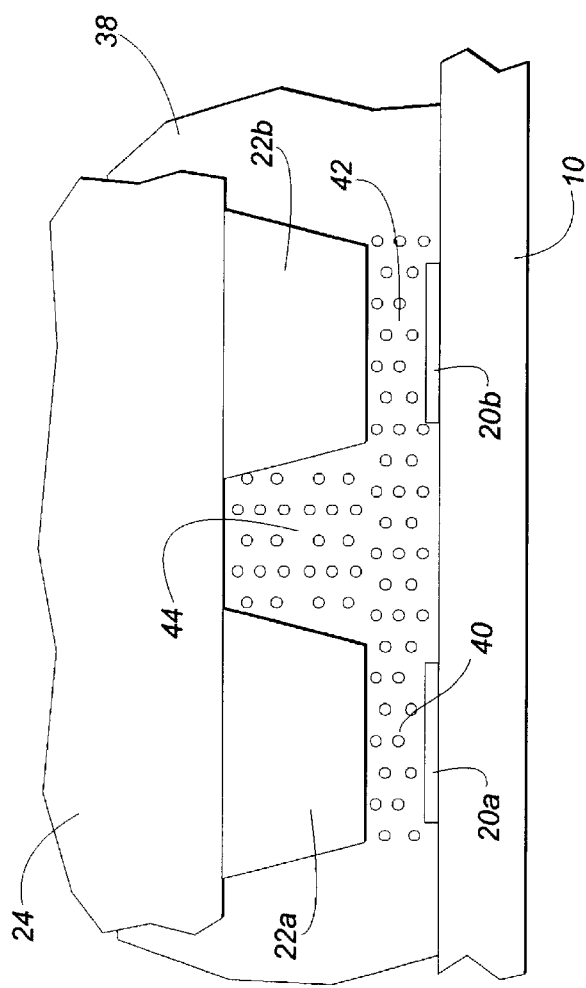
FIG. 5 is a partial schematic cross-sectional side view of an electronic component initially positioned in anisotropic conductive adhesive on the metallized glass substrate shown in FIG. 1.

It should be understood that when the electronic components 18, 24 are inserted into the adhesive 36, 38, they are inserted just enough to hold those components firmly in the adhesive, but not enough to make electrical contact. As can be see in FIG. 5, the LSIC 24 is placed into the adhesive 38 such that the bump 22a is in vertical alignment with the contact point 20a and the bump 22b is in vertical alignment with the contact point 20b. However, the LSIC 24 has not been pushed into the adhesive such that the pressure applied to the adhesive would make it electrically conductive. Therefore, the adhesive 38 is non-conductive at the points 40, 42, 44.

Figure 6:
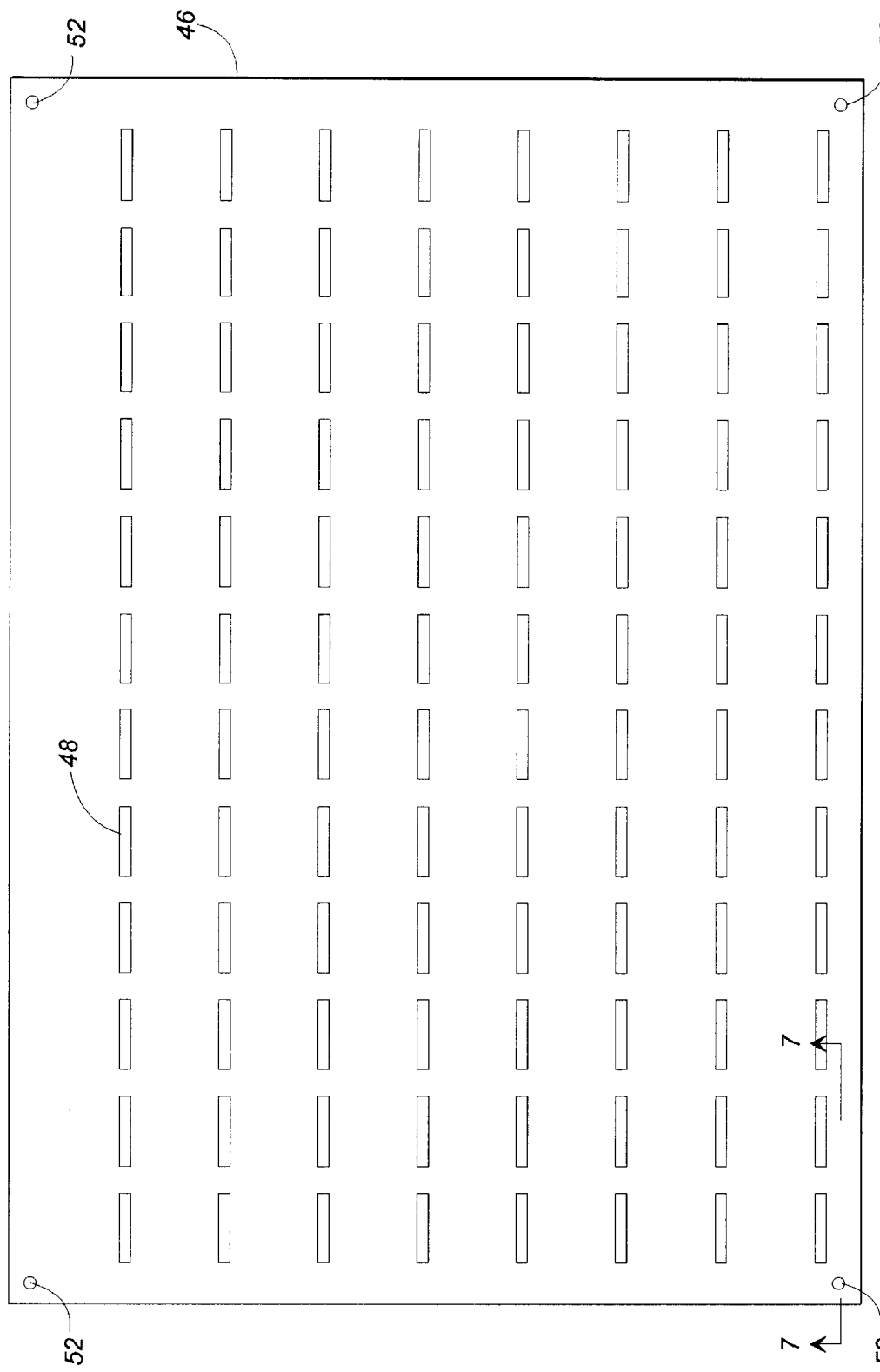
FIG. 6 is a bottom plan view of a disclosed embodiment of a die useful in the present invention.

After the electronic components 18, 24 are placed into the uncured adhesive, a die 46 (FIG. 6) is placed on top of the carrier 26. Disposed on the under surface of the die 46 are a plurality of pressure pads 48. The pads 48 are located on the die 46 such that they will be in vertical alignment with the electronic components 18, 24 in the adhesive on the substrate 10. As can be clearly seen in FIGS. 3, 4 and 8, the carrier 26 includes locator pins 50 at each corner thereof. The die 46 defines locator pin-receiving holes 52 (FIG. 7) at each corner thereof. Thus, when the locator pins 50 are received in the holes 52 (FIG. 9), the die 46 is accurately aligned with the carrier 26, and, consequently the pads 48 are accurately aligned with the electronic components 18, 24 in the adhesive 36, 38 on the substrates 10. The locator pins 50 and the holes 52 are sized and shaped so that when the pads 46 contact the electronic components in the adhesive on the substrates 10 in the carrier 26, the die 48 floats on top of the carrier; i.e., the weight of the die and pads is applied to the electronic components 18, 24 and the locator pins do not support the weigh of the die and pads.

The die 46 is made from a substantially rigid material, such as aluminum or stainless steel. The die 46 is also designed to apply a desired amount of force or weight to the electronic components 18, 24 through the pads 48 thereon.

The pads 48 are made from an elastomeric material, such as silicone rubber. The particular type of elastomeric material that is selected and the thickness of the pads depends upon the amount of pressure that is desired to be applied to the electronic components 18, 24. Furthermore, although the invention is illustrated as using one pad 48 to apply pressure to both the capacitor 18 and LSIC 24 (FIG. 9), it is specifically contemplated that separate pads can be used for each component on the substrate; i.e., one pad could be used for the capacitor and a separate pad could be used for the LSIC. When separate pads are used, they can be made from different materials, they can be of different thicknesses or both in order to apply different forces to the capacitor 18 and the LSIC 24, as needed. The pressure pads 48 can also be of different thicknesses to accommodate different sized electronic components.

Figure 7:
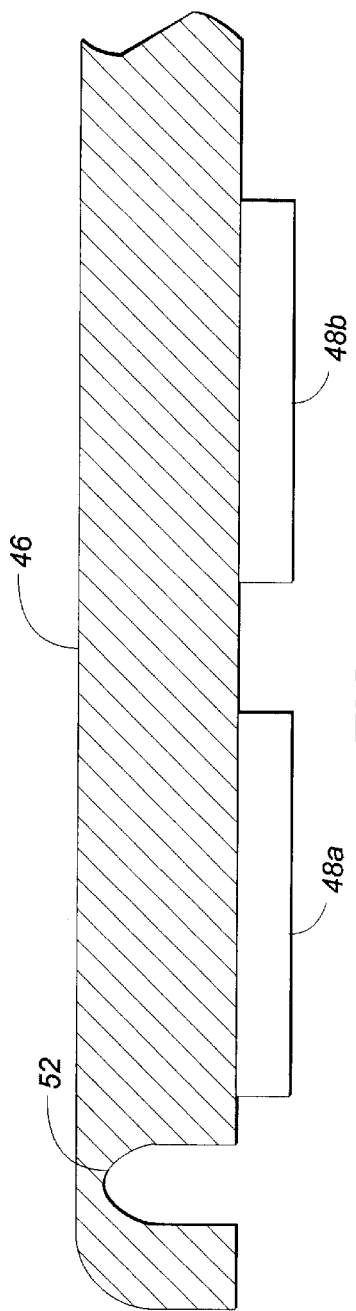
FIG. 7 is a detail cross-sectional view taken along the line 7—7 of the die shown in FIG. 6.
Figure 9:
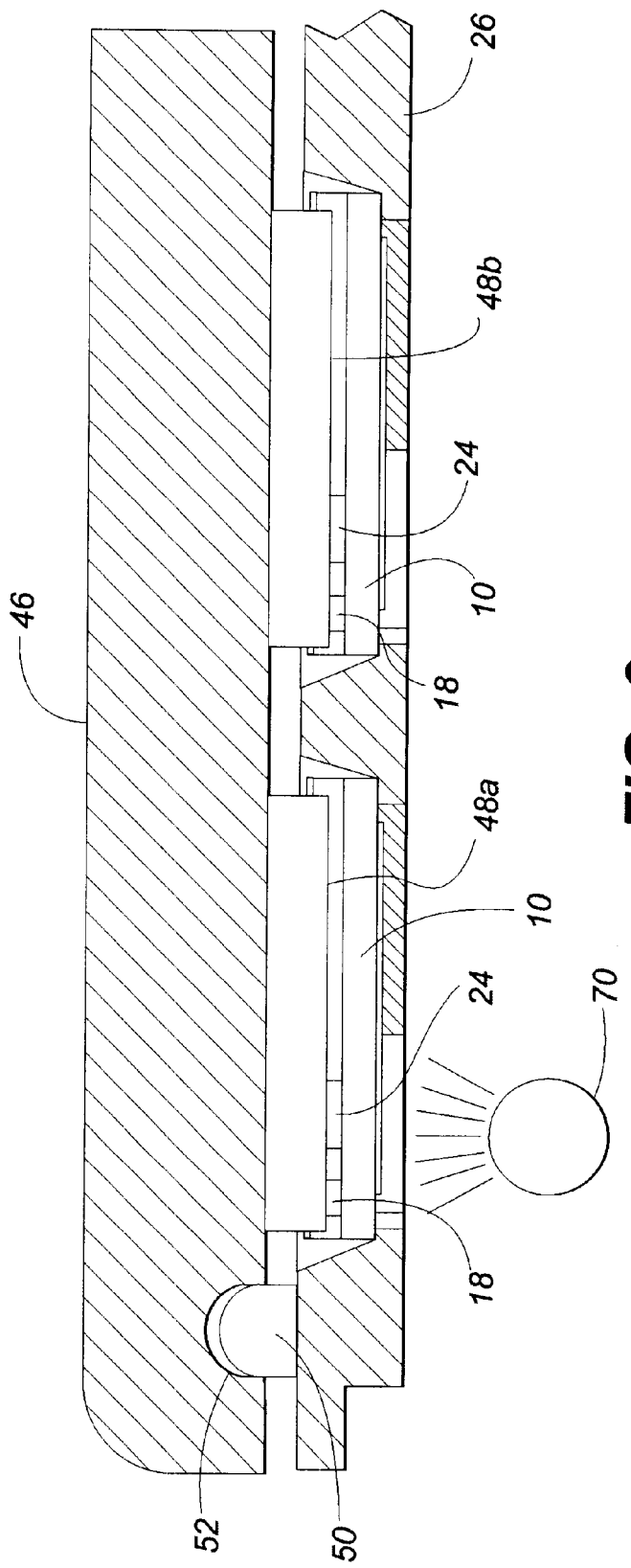
FIG. 9 is a partial cross-sectional side view of the die and carrier shown in FIG. 8 shown in an assembled condition.

As can be seen in FIGS. 7–9, a pressure pad 48a contacts the electronic components 18, 24 on one substrate 10 disposed in the carrier 26 and a pressure pad 48b contacts the electronic components on the adjacent substrate disposed in the carrier. The weight of the die 46 and pads 48 is therefore applied simultaneously to all of the electronic components on the substrates in the carrier 26.

Figure 11:
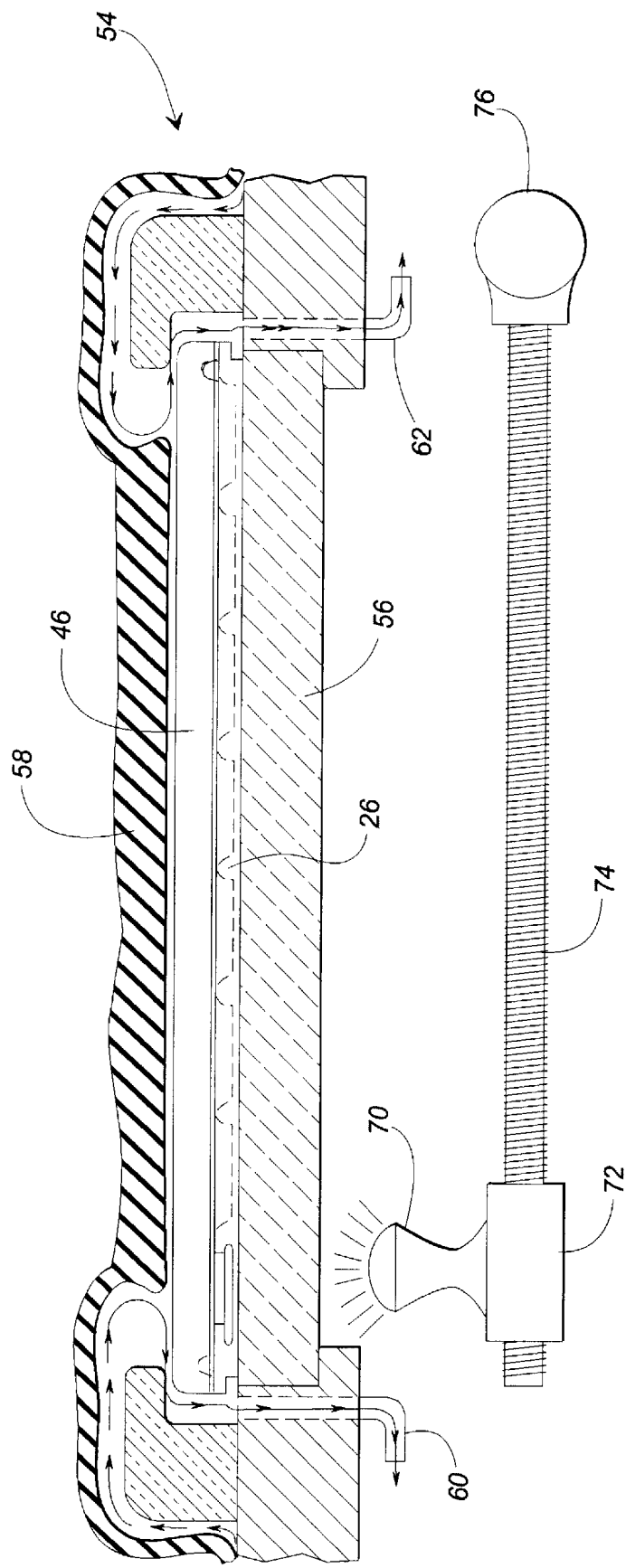
FIG. 11 is a schematic cross-sectional side view of the assembly shown in FIG. 9 received in an evacuation chamber and adhesive curing station.

After the die 46 is placed on the carrier 26, the assembly is placed into a vacuum chamber 54 (FIG. 11). The vacuum chamber 54 is defined by a glass platen 56 on the bottom and an elastomeric diaphragm 58 on the top. When the assembly is placed into the vacuum chamber 54, the carrier 26 rests on the glass platen 56 and the diaphragm 58 rests on the die 46. The glass platen 56 is made from a material that is substantially transparent to ultraviolet radiation. Vacuum conduits 60, 62 are connected at one end to a vacuum pump (not shown) and at their other end to the space between the glass platen 56 and the diaphragm 58. Thus, when the vacuum pump (not shown) is activated, a partial vacuum is created in the space between the glass platen 56 and the diaphragm 58. This partial vacuum draws the diaphragm 58 down into contact with the die 46 and thereby exerts additional pressure through the die and pads 48 to the electrical components 18, 24 being adhered to the printed circuit 12 on the substrate 10. The pressure that is applied to the electronic components is therefore the sum of the weight of the die 46 and pads 48 plus the pressure exerted by the diaphragm 58. Since the pressure exerted by the diaphragm 58 is a function of the partial vacuum inside the vacuum chamber 54 and the atmospheric pressure outside the vacuum chamber, and since the amount of vacuum drawn on the vacuum chamber can be varied, the amount of pressure exerted on the electronic components 18, 24 can be very precisely controlled. The amount of vacuum that is drawn in the vacuum chamber 54 is a sufficient amount to provide a total force applied to the electronic components so as to render the adhesive anisotropically conductive. Generally, approximately 0.4–0.8 atmospheres, preferably approximately 0.6 atmospheres are useful. The total amount of pressure that is applied by the die is approximately 30–40 psi. However, since the area to which the force is applied is quite small, such as 0.00032 in$^2$, the actual pressure that is applied to the electronic components is quite high. The amount of pressure that must be applied to the electronic components also depends on the type of adhesive that is used. Thus, the amount of pressure that is applied to the electronic components is approximately 1,000–10,000 psi; preferably, approximately 3,000 psi for Uniax 184 epoxy adhesive and approximately 6,000 psi for Uniax 183 epoxy adhesive.

The diaphragm 58 is preferably made from neoprene rubber. The diaphragm 58 has a thickness of approximately 0.015–0.030 inches. It is specifically contemplated that other types of elastomeric materials and other thicknesses of material can be effectively used in the present invention.

Figure 10:
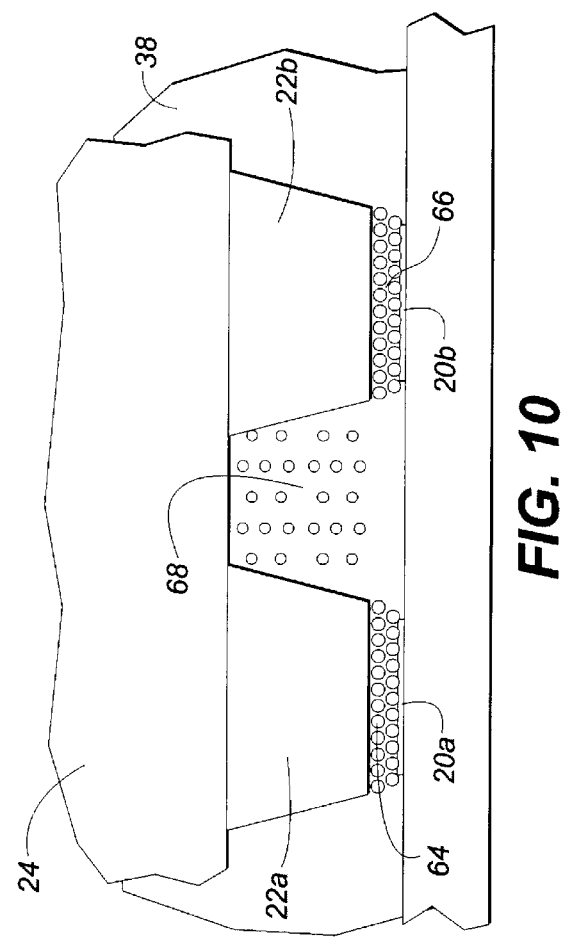
FIG. 10 is a partial schematic cross-sectional side view of an electronic component finally positioned in anisotropic conductive adhesive on the metallized glass substrate shown in FIG. 1.

By applying sufficient pressure to the electronic components 18, 24, the components are moved closer to the substrate 10, and, consequently, the electrical contacts or bumps are moved closer to the electrical contact points 14, 20. As shown in FIG. 10, after sufficient pressure is applied to the LSIC 24, the bumps 22a, 22b are sufficiently close to the contact points 20a, 20b of the printed circuit 12 and the adhesive between the bumps and the contact point is sufficiently compressed that the adhesive is electrically conductive at points 64, 66, such that the bumps are in electrical contact with the respective contact points, but the adhesive is still substantially non-conductive elsewhere, such as at 68.

After the desired amount of pressure is applied to the electronic components 18, 24 so that an electrical connection is established between the electrical contacts and bumps 16, 22 and the contact points 14, 20, respectively, of the printed circuit 12, the adhesive 36, 38 is cured by exposure to a sufficient amount of ultraviolet radiation. Disposed below the glass platen 56 of the vacuum chamber 54 is a source of ultraviolet radiation. As shown in FIG. 11, the source of ultraviolet radiation is an ultraviolet emitting light bulb 70, such as a 23 mm diameter type D bulb from Fusion UV Systems, Inc. of Gaithersburg, Md. The bulb 70 is mounted on a trolley 72 that is attached to a rotatably mounted screw 74. One end of the screw 74 is attached to a motor 76 that can turn the screw in either direction. When the motor 76 turns the screw 74, it causes the trolley 72 and the attached bulb 70 to move transversely across the width of the vacuum chamber 54. The bulb should be approximately as long as the carrier 26 is long so that the bulb will illuminate all of the substrates 10 in a single column of substrate receiving cavities 28. In the embodiment disclosed herein, the bulb 70 is approximately 10 inches (25 cm) long and provides approximately 3 Kwatts of light. The bulb 70, trolley 72, screw 74 and motor 76 are aligned so that the light from the bulb 70 scans across the rows of substrates 10 in the substrate-receiving cavities 28 of the carrier 26 as the trolley moves across the width of the carrier 26. The trolley 72 traverses the width of the carrier 26 at a speed of approximately 10–25 meters per minute. In this way, all of the substrates 10 in the carrier 26 can be scanned with the ultraviolet radiation simultaneously.

The amount of ultraviolet radiation that is required to cure the epoxy adhesive depends on several variables. Among those variable are the wavelength of the ultraviolet radiation, the intensity of the ultraviolet radiation (or flux), the length of exposure, and the chemical nature of the ultraviolet radiation-curable adhesive. For the present invention, it is desirable to use ultraviolet radiation having a wavelength of approximately 350–500 nm; preferably, approximately 355–435 mn; especially, approximately 390 nm. The bulb 70 produces an ultraviolet light flux intensity of approximately 10,600 mw/cm² at the source. Due to the relatively high heat output of the bulb 70, it is necessary to keep the bulb far enough away from the platen 56 so that excessive heat is not applied to the substrates 10 and the electronic components 18, 14. The bulb 70 is therefore located approximately 0.1–2 inches below the platen 56. Instead of mounting the ultraviolet light source on the trolley, it is specifically contemplated that the ultraviolet light source may be located at a remote location and the ultraviolet light can be piped to the trolley through an ultraviolet light guide (not shown), such as a 3 mm diameter light guide.

The adhesive to be cured is exposed to the ultraviolet radiation for a period of time sufficient to cure the adhesive. The amount of time required to cure the adhesive will depend on several variables including the chemical nature of the adhesive and the flux intensity of the ultraviolet light at the adhesive. However, for flux intensities as described above, the ultraviolet radiation exposure time necessary to cure the epoxy adhesive will be approximately 15–30 seconds; preferably, approximately 20 seconds. The amount of ultraviolet light energy that is necessary to cure the adhesive is approximately 0.1–0.3 joules/cm²; preferably, approximately 0.2 joules/cm²

The temperature at which the adhesive is cured with the ultraviolet radiation is not a critical parameter of the present invention. Curing of the adhesive can take place across a broad range of temperatures, such as 5°–80° C. However, it is a novel aspect of the present invention that the use of ultraviolet radiation to cure the adhesive does not result in the overall excessive heating of the printed circuit 12 or other temperature-sensitive electronic components to temperatures above 80° C. Thus, the risk of damage to delicate electronic components due to exposure to excessive levels of heat; i.e., temperatures above 80° C., is avoided by the present invention.

After the adhesive has been exposed to sufficient ultraviolet radiation to substantially cure the adhesive, the vacuum pump is turned off and normal, atmospheric pressure is restored in the vacuum chamber 54. Restoration of atmospheric pressure within the vacuum chamber 54 causes the diaphragm 58 not to exert additional pressure on the die 46. Then, the vacuum chamber 54 may be opened and the assembly of the carrier 26 and the die 46 may be removed therefrom. After removal from the vacuum chamber 54, the die 46 is lifted off the carrier 26 and the substrates 10 with the electronic components 18, 24 adhered thereto can be removed therefrom, such as with a robotically controlled arm (not shown).

It should be understood, of course, that the foregoing relates only to certain disclosed embodiments of the present invention and that numerous modifications or alterations may be made therein without departing from the spirit and scope of the invention as set forth in the appended claims.

What is claimed is:

1. A method comprising:
    depositing a desired quantity of an uncured, ultraviolet radiation-curable, anisotropic conductive adhesive in a desired location on a metallized glass substrate having an electric circuit formed on a surface of said substrate;
    applying to said uncured, deposited adhesive an electronic component, said electronic component having electrical contact bumps formed on a portion thereof, said electronic component being oriented so that said bumps are positiioned in said adhesive and in register with desired portions of said electric circuit on said substrate;
    applying to said electronic component an amount of pressure sufficient to render said adhesive selectively conductive at locations between said electric circuit and said electrical contact bumps on said active device and substantially nonconductive at other locations, such that said bumps make electrical contact with desired portions of said electric circuit, wherein said pressure is applied to said active device by a die positioned on top of said active device and wherein additional pressure is applied to said active device by positioning a diaphragm on top of said die and applying a vacuum to said diaphragm; and
    irradiating said adhesive with sufficient ultraviolet radiation to substantially cure said adhesive.

2. The method of claim 1, wherein said substrate is substantially transparent to said ultraviolet radiation.

3. The method of claim 2, wherein said adhesive is irradiated by ultraviolet radiation passing through said substrate.

4. The method of claim 1, wherein said adhesive is irradiated with ultraviolet radiation energy of approximately 0.1–0.3 joules/cm².

5. The method of claim 1, wherein said adhesive is an anisotropic electrically conductive epoxy.

6. The method of claim 1, wherein said adhesive is applied in an amount sufficient to form a layer approximately 12–45 microns in thickness.

7. The method of claim 1, wherein said bumps on said active device are approximately 25–30 microns in thickness.

8. The method of claim 1, wherein said adhesive has a viscosity of approximately 100,000–300,00 centipoise at 25° C.

9. The method of claim 1, wherein said ultraviolet radiation has a wavelength of approximately 300–500 nm.

10. The method of claim 1, wherein said ultraviolet radiation has a wavelength of approximately 355–435 nm.

11. The method of claim 1, wherein said pressure applied to said electronic components is approximately 1,000–10,000 psi.

12. The method of claim 1, wherein said adhesive is irradiated with said ultraviolet radiation for a period of approximately 15–30 seconds.

13. A method comprising:
    placing a plurality of metallized glass substrates having an electric circuit formed on a surface of said substrate into a carrier, said carrier defining a plurality of cavities, each cavity being adapted to receive and retain a substrate therein;
    depositing a desired quantity of an uncured, ultraviolet radiation-curable, anisotropic adhesive in a desired location on each of said substrates in said carrier;
    inserting into said uncured, deposits of adhesive on each said substrate an electronic device, said electronic device having electrical contact bumps formed on a portion thereof, said electronic device being oriented so that said bumps are positioned in said adhesive and in register with desired portions of said electric circuit on said substrate;
    simultaneously applying to each active device an amount of pressure sufficient to render said adhesive selectively conductive at locations between said electric circuit and said electrical contact bumps on said electronic devices and substantially nonconductive at other locations, such that desired ones of said bumps make electrical contact with desired portions of said electric circuit; and simultaneously irradiating said adhesive deposits on a plurality of said substrates with ultraviolet radiation of a sufficient flux and for a sufficient time to substantially cure said adhesive.

14. The method of claim 13, wherein said substrate is substantially transparent to said ultraviolet radiation.

15. The method of claim 14, wherein said adhesive is irradiated by ultraviolet radiation passing through said substrate.

16. The method of claim 13, wherein said adhesive is irradiated with ultraviolet radiation energy of approximately 0.1–0.3 joules/cm$^2$.

17. The method of claim 13, wherein said pressure is applied to said active devices by a die positioned on top of said active devices.

18. The method of claim 13, wherein additional pressure is applied to said active devices by positioning a diaphragm on top of said die and applying a vacuum to said diaphragm.

19. The method of claim 13, wherein said adhesive is an anisotropic, electrically conductive epoxy.

20. The method of claim 13, wherein said adhesive is applied in an amount sufficient to form a layer of approximately 12–45 microns in thickness.

21. The method of claim 13, wherein said bumps on said electric device are approximately 10–30 microns in thickness.

22. The method of claim 13, wherein said adhesive has a viscosity of approximately 100,000–300,00 at 25° C.

23. The method of claim 13, wherein said ultraviolet radiation has a wavelength of approximately 300–500 nm.

24. The method of claim 13, wherein said ultraviolet radiation has a wavelength of approximately 355–435 nm.

25. The method of claim 13, wherein said pressure applied to said active devices is approximately 1,000–10,000 psi.

26. The method of claim 13, wherein said adhesive is irradiated with said ultraviolet radiation for a period of approximately 15–30 seconds.

27. A method comprising:

placing a plurality of metallized glass substrates having an electric circuit formed on a surface of said substrate into a carrier, said carrier defining a plurality of cavities, each cavity being adapted to receive and retain a substrate therein, said carrier and substrate being substantially transparent to ultraviolet radiation;

depositing a desired quantity of an uncured, ultraviolet radiation-curable, anisotropic adhesive in a desired location on each of said substrates in said carrier;

inserting into said uncured, deposits of adhesive on each said substrate an electronic device, said electronic device having electrical contact bumps formed on a portion thereof, said electronic device being oriented so that said bumps are positioned in said adhesive and in register with desired portions of said electric circuit on said substrate;

positioning a die above said carrier, said die having a plurality of pressure pads disposed on said side of said die adjacent said carrier, said pressure pads being adapted and arranged for contacting said electronic devices on said substrates;

placing said die and carrier in a vacuum chamber partially defined by an elastomeric diaphragm, such that said diaphragm overlies said die; at least partially evacuating said vacuum chamber such that said diaphragm is drawn into contact with and exerts pressure on said die, whereby an amount of pressure sufficient to render said adhesive selectively conductive at locations between said electric circuit and said electrical contact bumps on said active device and substantially nonconductive at other locations is simultaneously applied to each active device, such that desired ones of said bumps make electrical contact with desired portions of said electric circuit; and simultaneously irradiating said adhesive deposits with ultraviolet radiation of a sufficient flux and for a sufficient time to substantially cure said adhesive.

28. The method of claim 27, wherein said ultraviolet radiation comes from a source positioned below said vacuum chamber and said vacuum chamber is at least partially defined by a glass platen that is substantially transparent to ultraviolet radiation and said platen is positioned between said carrier and said source of ultraviolet radiation.

29. A process for mounting at least one electronic device having electrical contacts onto each of a plurality of interconnection substrates each having electrical conductors so as to establish an electrical interconnection between said contacts and said conductors, said interconnection substrates being substantially transparent to ultraviolet radiation, said process comprising:

(a) positioning a plurality of substrates in a carrier;

(b) applying a quantity of uncured, ultraviolet radiation-curable, anisotropic adhesive over a region on each interconnection substrate, said region including conductors to be electrically connected to contacts of said at least one device;

(c) forming an assembly of said at least one device and said interconnection substrates by placing at least one device on each interconnection substrate such that the contacts of said at least one device are in alignment with the conductors in said region of said substrate;

(d) positioning a die above said carrier, said die including a plurality of pressure pads, said pressure pads being disposed on said die such that said pressure pads contact said at least one device on said substrates when said die is positioned above said carrier;

(e) simultaneously applying pressure to said devices through said pressure pads so as to force the contacts of said at least one device toward the conductors of the substrate; and (f) simultaneously irradiating said adhesive on a plurality of said substrates with ultraviolet radiation from a source positioned below said substrates such that said adhesive forms an electrical and mechanical interconnection between the contacts of said at least one devices and the conductors of each said substrate.

* * * * *